(12) United States Patent
Lee et al.

(10) Patent No.: US 11,901,468 B2
(45) Date of Patent: Feb. 13, 2024

(54) SEMICONDUCTOR PACKAGING INCLUDING PHOTOVOLTAIC PARTICLES HAVING A CORE-SHELL STRUCTURE

(71) Applicant: SOFTPV Inc., Seongnam-si (KR)

(72) Inventors: Sunggue Lee, Hwaseong-si (KR); Hyeonwoo Ahn, Seongnam-si (KR)

(73) Assignee: SOFTPV INC., Seongnam-si (KR)

( * ) Notice: Subject to any disclaimer, the term of this patent is extended or adjusted under 35 U.S.C. 154(b) by 0 days.

(21) Appl. No.: 17/956,123

(22) Filed: Sep. 29, 2022

(65) Prior Publication Data

US 2023/0155040 A1 May 18, 2023

(30) Foreign Application Priority Data

Nov. 12, 2021 (KR) .................. 10-2021-0155993

(51) Int. Cl.
*H01L 31/0224* (2006.01)
*H01L 31/054* (2014.01)
(Continued)

(52) U.S. Cl.
CPC ........... *H01L 31/022425* (2013.01); *H01L 31/02008* (2013.01); *H01L 31/048* (2013.01); *H01L 31/054* (2014.12)

(58) Field of Classification Search
CPC ....... H01L 31/02008; H01L 31/022425; H01L 31/0352; H01L 31/035281; H01L 31/048; H01L 31/0508; H01L 31/0547
See application file for complete search history.

(56) References Cited

U.S. PATENT DOCUMENTS 8,686,280 B2 * 4/2014 Nakata .................. H01L 31/042
  136/250
8,778,704 B1 7/2014 Lau et al.
(Continued)

FOREIGN PATENT DOCUMENTS

CN 108461580 A 8/2018
CN 113224185 A 8/2021
(Continued)

OTHER PUBLICATIONS

Office Action issued in KR patent application Serial No. 10-2021-0155993 dated Oct. 29, 2022, with English machine translation.
(Continued)

*Primary Examiner* — Mayla Gonzalez Ramos
(74) *Attorney, Agent, or Firm* — Westman, Champlin & Koehler, P.A.; Amanda M. Prose (57) ABSTRACT

The present disclosure relates to a semiconductor packaging capable of supplying power by itself by including, as a power supply part, photovoltaic particles having a core-shell structure, wherein the photovoltaic particles in a semiconductor package generate voltage and current required for semiconductors so that the semiconductor package can be easily driven only with the power generated by itself, it is possible to overcome the restrictions on miniaturization of semiconductor packages due to connection with external power sources, and the photovoltaic particles are located between a semiconductor chip and a substrate so that the semiconductor package is easy to miniaturize.

11 Claims, 4 Drawing Sheets

(51) Int. Cl.
*H01L 31/02* (2006.01)
*H01L 31/048* (2014.01)

(56) References Cited

U.S. PATENT DOCUMENTS

| | | | |
|---|---|---|---|
| 2004/0008588 | A1 | 1/2004 | Minami et al. |
| 2009/0277497 | A1* | 11/2009 | Nakata ................ H01L 31/0543 |
| | | | 136/246 |
| 2010/0018568 | A1* | 1/2010 | Nakata ................ H01L 31/0504 |
| | | | 136/246 |
| 2010/0219423 | A1* | 9/2010 | Nakata ................ H01L 31/0508 |
| | | | 257/E33.056 |
| 2014/0225211 | A1 | 8/2014 | Lau et al. |
| 2015/0311855 | A1 | 10/2015 | Kubota et al. |
| 2019/0229047 | A1 | 7/2019 | Moon et al. |
| 2020/0144237 | A1 | 5/2020 | Kang et al. |

FOREIGN PATENT DOCUMENTS

| | | |
|---|---|---|
| JP | 2001-274432 A | 10/2001 |
| JP | 2001339086 A | 12/2001 |
| JP | 5409707 B2 | 2/2014 |
| KR | 10-2012-0093880 A | 8/2012 |
| KR | 102197811 B1 | 1/2021 |
| KR | 2279914 B1 | 7/2021 |
| WO | 2002/035613 A1 | 5/2002 |

OTHER PUBLICATIONS

Extended European Search Report issued for EP patent application Serial No. 22199051.8, dated Jan. 19, 2023.

Meissner, D. "Photovoltaics Based on Semiconductor Powders" Formatex (2013), pp. 114-125, Retrieved from the Internet <http://www.formatex.info/energymaterialsbook/book/114-125.pdf> retrieved on Nov. 5, 2014.

"Unique technology in the world Spherical Solar Cell (Sphelar)" (May 6, 2021), pp. 1-35, Retrieved from the Internet <http://www/sphelarpower/com/dl_document/dl/sphelar_power_document_en_2104.pdf> retrieved on Jan. 9, 2023.

Office Action issued for JP patent application Serial No. 2022-155552 dated Nov. 7, 2023, along with English machine translation.

* cited by examiner

SEMICONDUCTOR PACKAGING INCLUDING PHOTOVOLTAIC PARTICLES HAVING A CORE-SHELL STRUCTURE

TECHNICAL FIELD

This application claims priority from Korean Patent Application No. 10-2021-0155993, filed on Nov. 12, 2021, which is hereby incorporated by reference for all purposes as if fully set forth herein.

The present disclosure relates to a semiconductor packaging capable of supplying power by itself by photovoltaic power generation.

BACKGROUND

A semiconductor package includes a substrate such as a lead frame and a printed circuit board, a semiconductor chip attached to the substrate, a conductive means such as a conductive wire or a bump that connects the semiconductor chip and the substrate for the exchange of electrical signals therebetween, a molding resin molded to protect the semiconductor chip, the conductive means, etc. from the outside, and so on.

The semiconductor package manufactured in that way is mounted on a motherboard of an electronic device (mobile phone, laptop, etc.) as a CPU or memory. Most semiconductor packages consume a certain level of power as they are driven based on power supplied to electronic devices.

Multiple semiconductor packages as the CPU and the memory are mounted on the motherboard of electronic devices, which is one of the factors in an increase in power consumption. However, in the process of miniaturization of semiconductor packages, the design of a structure where a separate power supply part is connected is reaching its limit, and, in the environment of the Internet of Things (IoT), etc., which requires an independent sensor device and a communication device necessary therefor, a semiconductor package having a semi-permanent power supply device therein is required.

SUMMARY

The purpose of the present disclosure is to provide a semiconductor package that is capable of supplying power to semiconductors semi-permanently and autonomously by photovoltaic power generation, generates a large amount of power, and is easy to miniaturize.

In order to achieve the aforementioned purpose, the semiconductor packaging of the present disclosure includes, as a power supply part, photovoltaic particles having a core-shell structure including a core part and a shell part.

Here, the core part and the shell part of the photovoltaic particles may be different electrodes selected from an anode and a cathode.

Specifically, the semiconductor packaging may include a substrate, a power generation connection layer positioned on the substrate and including external terminals and the photovoltaic particles, and a semiconductor layer positioned on the power generation connection layer.

In this case, the power generation connection layer may include a plurality of photovoltaic particles, the plurality of photovoltaic particles may be connected to each other in series or in parallel, and the power generation connection layer may include the plurality of photovoltaic particles spaced apart from each other.

To be specific, the semiconductor layer may include a semiconductor chip and a mold portion surrounding the semiconductor chip, and the mold portion may allow light to pass through itself.

A rearrangement layer may be located between the power generation connection layer and the semiconductor layer, and the external terminals and the photovoltaic particles may be formed as a single layer and attached to one surface of the rearrangement layer.

In addition, the rearrangement layer may include an extension extending to at least a portion of an upper surface of the semiconductor layer, the photovoltaic particles may be positioned on the extension, and the external terminals and the photovoltaic particles may be formed as a single layer and attached to the other surface of the rearrangement layer as well.

Meanwhile, to increase power generation, the semiconductor package may include reflection portions, and the reflection portions may be formed around the power generation connection layer on the substrate.

Furthermore, the photovoltaic particles may be positioned around the power generation connection layer.

In the semiconductor packaging including the photovoltaic particles having the core-shell structure according to the present disclosure, the semiconductor package can be easily driven only with power generated by itself by virtue of the excellent power production of the photovoltaic particles, thereby overcoming the restrictions on miniaturization of semiconductor packages due to connection with external power sources, and the photovoltaic particles are located between the semiconductor chip and the substrate so that the semiconductor package is easy to miniaturize.

In addition, as it is possible to semi-permanently supply power to the semiconductor package by the photovoltaic particles embedded in the semiconductor package, existing problems such as deletion of a semiconductor memory due to cut-off external power can be solved.

Furthermore, voltage and current required for semiconductors can be easily obtained by the photovoltaic particles that can be easily connected in series or in parallel, which are power sources of the semiconductor packaging.

DETAILED DESCRIPTION

Interpretation of terms or words used in this specification and the accompanying claims should not be limited to ordinary or dictionary meanings, and the terms or words should be interpreted with meanings consistent with the technology of the present disclosure based on the principle that an inventor can appropriately define meanings of terms to best describe his/her invention.

Accordingly, features shown in the embodiments and manufacturing examples described in the specification are only the most preferred embodiments of the present disclosure, and do not show all of the technology of the present disclosure. Therefore, it should be understood that the features may be substituted with various equivalents and modifications at the time of filing the present application.

Hereinafter, the embodiments of the present disclosure will be described in detail with reference to the drawings so that a person having ordinary skill in the technical field to which the present disclosure belongs can easily perform the embodiments. However, the present disclosure may be embodied in several different forms and is not limited to the manufacturing examples and embodiments described herein.

A semiconductor packaging according to an aspect of the present disclosure may be characterized by including, as a power supply part, photovoltaic particles having a core-shell structure including a core part and a shell part, and it may be possible to drive the semiconductor packaging even in an environment without a separate external power source. Therefore, of course, a separate battery, etc. may be used to additionally supply power to the semiconductor packaging.

Figure 1:
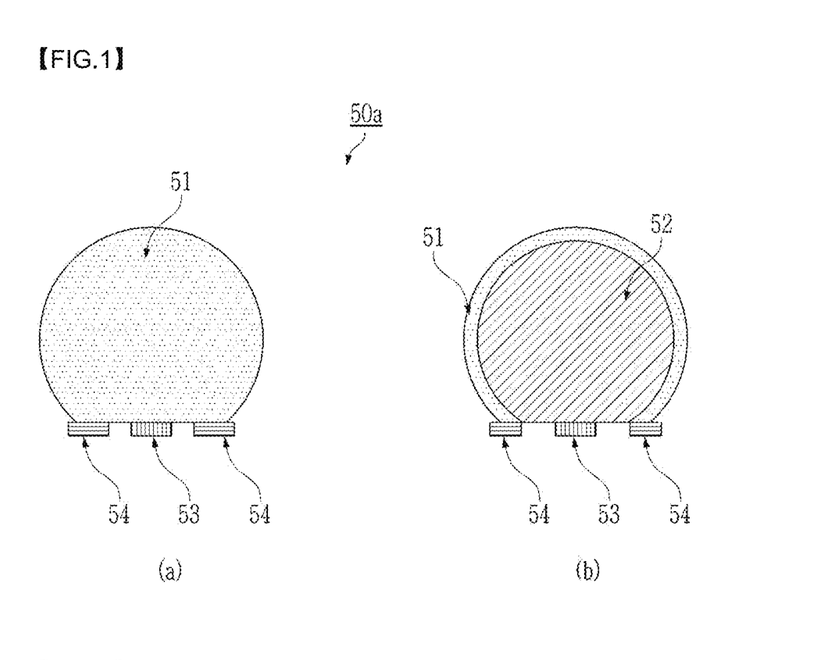
FIG. 1 shows that a first electrode and a second electrode of a photovoltaic particle according to an embodiment of the present disclosure are formed in the same direction.
Figure 2:
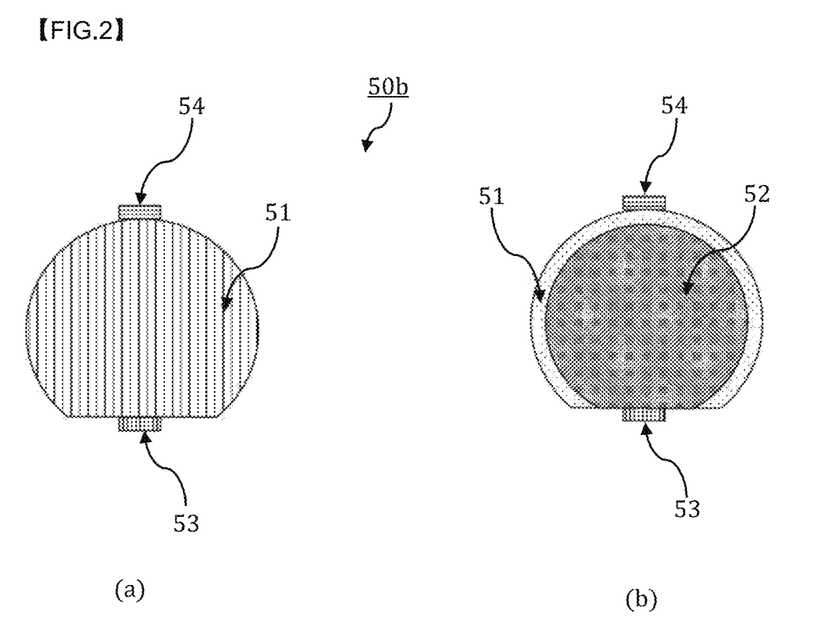
FIG. 2 shows that the first electrode and the second electrode of the photovoltaic particle according to an embodiment of the present disclosure are formed in opposite directions.

The photovoltaic particles used as the power supply part of the semiconductor packaging of the present disclosure may not be a typical flat solar cell, but may have a three-dimensional shape and the core-shell structure including the core part and the shell part. FIGS. 1 and 2 respectively show the structure of the photovoltaic particle according to an embodiment of the present disclosure, and figure (a) of each of FIGS. 1 and 2 shows the outside of the photovoltaic particle while figure (b) of each of FIGS. 1 and 2 is a cross-sectional view showing the inside as well. Retelling to FIG. 1, the photovoltaic particle 50a may include the core part 52 and the shell part 51 formed outside the core part 52. In this case, the shell part 51 may not completely cover the outside of the core part 52, and the core part 52 may be exposed on one side. As a result, a first electrode 53 may be formed. In addition, a second electrode 54 electrically connected to the shell part 51 and insulated from the core part 52 may be formed. Here, a separate insulating layer 55 may be formed in the second electrode 54 for the insulation from the core part 52, but a structure where the second electrode 54 is in contact only with the shell part 51 as shown in figure (b) of FIG. 1 may also be possible. Furthermore, when the second electrode 54 is formed in the same direction as the first electrode as in the embodiment in FIG. 1, it may have a ring shape. FIG. 1 shows a structure in which both the first electrode 53 and the second electrode 54 are formed in the same direction on one side of the photovoltaic particle 50a according to an embodiment of the present disclosure, and FIG. 2 shows a structure in which the second electrode 54 of the photovoltaic particle 50b is formed in a direction opposite to the direction in which the first electrode 53 is formed. As long as the second electrode 54 of the photovoltaic particle according to an embodiment of the present disclosure is insulated from the core part, it may be formed at any position on the surface of the shell part 51 without limitation in direction. The embodiment of the photovoltaic particle in FIG. 1 may be applied to a structure in which an anode and a cathode need to be formed on the same surface as the power supply part of the semiconductor packaging, and the embodiment of the photovoltaic particle in FIG. 2 may be applied to a structure in which an anode and a cathode need to be formed on opposite surfaces as the power supply part of the semiconductor packaging.

The core part 52 and the shell part 51 of the photovoltaic particle 50 may form the first electrode 53 and the second electrode 54, respectively, and, specifically, the core part 52 and the shell part 51 may form different electrodes selected from an anode and a cathode. For example, the core part 52 may include P-type or N-type silicon, and the shell part 51, which is a diffusion layer forming a P-N junction, may be formed outside the core part 52. The core part 52 may further include a P-type or N-type dopant.

For example, the photovoltaic particle 50 may have a structure where the core part 52 is formed of the P-type silicon and the shell part 51 that is an N-type diffusion layer is formed on the surface of the core part 52. In this case, the shell part 51 may be prepared by performing a doping process. $POCl_3$, $H_3PO_4$, etc. containing a group 5 element may be diffused into the core part 52 made of the P-type silicon at a high temperature. As a result, the shell part 51 that is the N-type diffusion layer may be formed. In addition, the core part 52 may have a structure in which it is made of silicon as well as a structure in which an insulating ball is coated with silicon. The insulating ball may be made of various materials such as glass and ceramic. However, not limited to the above-mentioned example, the P-type and N-type semiconductors of the core part 52 and the shell part 51 may be formed in reverse, so the core part 52 may be formed as an N-type semiconductor while the shell part 51 may be formed as a P-type semiconductor.

The photovoltaic particle 50 may be capable of generating power not only with ultraviolet light but also with photons with weak energy such as visible light and infrared light. That is, since the power generation source of the photovoltaic particle 50 may not be limited to sunlight, the photovoltaic particle 50 may be capable of generating power indoors as well.

Figure 3:
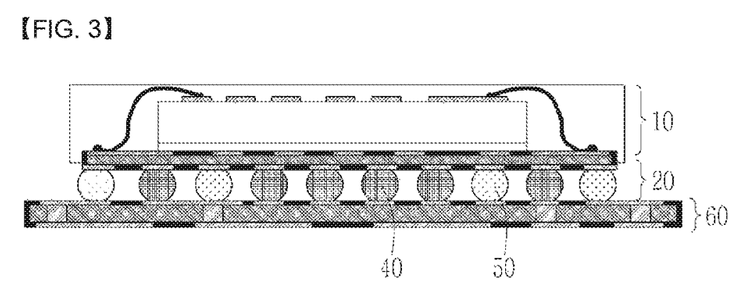
FIG. 3 is a cross-sectional view schematically showing main components of a semiconductor packaging according to an embodiment of the present disclosure.

FIG. 3 schematically shoals the main components of the semiconductor packaging according to an embodiment of the present disclosure. Referring to FIG. 3, to describe the structure of the semiconductor packaging in detail, the semiconductor packaging may further include a substrate 60, a power generation connection layer 20 positioned on the substrate 60, and a semiconductor layer 10 positioned on the power generation connection layer 20. The power generation connection layer 20 may mean a layer that generates electric power by itself and electrically connects the semiconductor layer 10 and the substrate 60. Specifically, the power generation connection layer 20 is characterized by including external terminals that electrically connect the semiconductor layer 10 and the substrate 60 to transmit signals of semiconductors and the photovoltaic particles 50 capable of serving as a power supply part of the semiconductor layer 10. When a conventional photovoltaic flat panel is applied to a semiconductor package, along with the additional process of subdividing a large wafer, the process of connecting a plurality of pieces of the cut wafer in series is necessary since the rated voltage required for a semiconductor is 0.5V or more, and the process of connecting the pieces of the wafer in parallel to supply a required current is also necessary. However, the process of connecting pieces of a flat wafer is very difficult. However, in the case of the semiconductor package of the present disclosure, the photovoltaic particles 50 may be very easily connected in series and in parallel, and the photovoltaic particles with an excellent power production may be applied to the semiconductor package. Therefore, the semiconductor package of the present disclosure is characterized in that the supply of power and voltage required for the semiconductors may be still possible while the volume of the semiconductor package may be greatly reduced compared to a semiconductor package based on a conventional flat-panel solar cell.

Since the photovoltaic particles 50 having the core-shell structure in the power generation connection layer 20 may have a three-dimensional structure, absorb light, and produce electricity, it may not be desirable that the photovoltaic particles 50 come in contact with external objects such as another photovoltaic particle or the external terminals except for their own electrodes, and, for this reason, the plurality of photovoltaic particles 50 may be formed to be spaced apart from each other in the power generation connection layer 20. Furthermore, it may be desirable that the photovoltaic particles 50 and the external terminals 40 are also spaced apart from each other. In the process of designing the power generation connection layer 20 where the external terminals 40 are placed in contact with a signal circuit in the semiconductor layer 10 and the photovoltaic particles 50 are in contact with a power circuit in the semiconductor layer 10, by virtue of the three-dimensional structure of the photovoltaic particles 50 where it may be possible that the photovoltaic particles 50 are spaced apart from each other, it may be easy to design the arrangement of the external terminals 40 and the photovoltaic particles 50 based on voltage and current required for the semiconductor layer 10.

In the power generation connection layer 20, the external terminals 40 may be formed in a general ball grid array shape, and the photovoltaic particles 50 may be formed in a ball shape similar to that of the external terminals 40. In addition, the external terminals 40 and the photovoltaic particles 50 in the ball grid array shape may be formed in a similar size, or the photovoltaic particles 50 may be formed in a slightly smaller size. For example, it may be desirable that the diameter of the photovoltaic particles 50 is approximately 20% smaller than that of the external terminals 40 since, in general, metals of the external terminals 40 may melt in a high-temperature reflow process and then adhere to a pad of the substrate 60 of the package so that the height of the external terminals tends to be lowered while the photovoltaic particles may not melt or shrink in height during the manufacturing process. However, the size of the photovoltaic particles is not particularly limited. The photovoltaic particles may be applied to a general semiconductor packaging, and, to this end, it may be desirable that the size of the photovoltaic particles is 0.3 to 2.0 mm.

Figure 4:
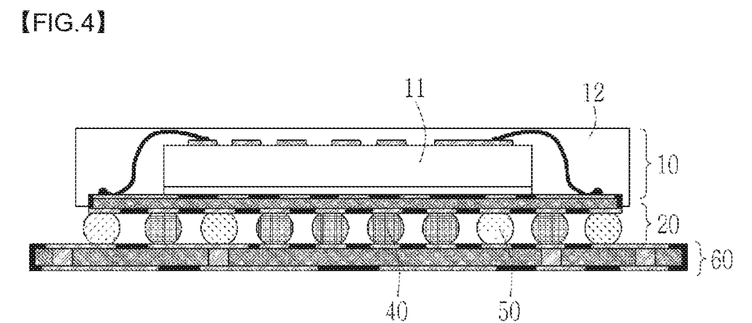
FIG. 4 is a cross-sectional view conceptually showing a semiconductor chip 11 and a mold portion 12 that surrounds and protects the semiconductor chip in a semiconductor layer 10 according to an embodiment of the present disclosure.

The photovoltaic particles 50 located between the substrate 60 and the semiconductor layer 10 may be capable of generating power only with light incident on the side of the power generation connection layer 20, but they may also use incident through the semiconductor layer to increase power production. FIG. 4 conceptually shows a semiconductor chip 11 and a mold portion 12 that surrounds and protects the semiconductor chip as the main components of the semiconductor layer 10. Referring to FIG. 4, a structure of a general semiconductor package may be applied to the connection part between the semiconductor chip 11 and the substrate 60, so a description thereof will not be provided herein. When a light-transmitting material that allows light to pass through the mold portion 12 protecting the semiconductor chip 11 is used in the semiconductor layer 10, the number of photons supplied to the photovoltaic particles 50 located in the power generation connection layer 20 may be increased, thereby increasing the power production of the power generation connection layer 20. In addition, it may be desirable that the mold portion is transparent, and various transparent resins such as epoxy-based, urethane-based, silicone-based, acrylic-based, polyimide-based, and PMMA-based resins may be used therefor.

Figure 5:
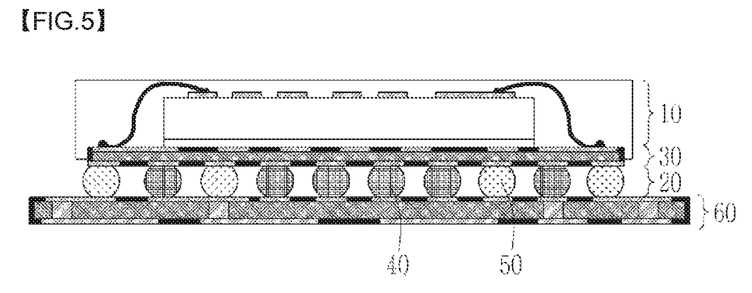
FIG. 5 is a cross-sectional view showing a structure in which a rearrangement layer 30 is formed according to an embodiment of the present disclosure.

A circuit for connecting the plurality of photovoltaic particles 50 in the power generation connection layer 20 in series or in parallel to supply voltage and current required for the semiconductor layer 10 may be included, and a rearrangement layer 30 for aligning the connection terminals 40 and the photovoltaic particles 50 may be additionally disposed. FIG. 5 conceptually shows the position of the rearrangement layer 30, and the rearrangement layer 30 may be located between the power generation connection layer 20 and the semiconductor layer 10. The arrangement of the external terminals 40 and the photovoltaic particles 50 may be fixed by the rearrangement layer 30 and the substrate 60. In this case, it may be desirable that the external terminals 40 and the photovoltaic particles 50 are formed as a single layer and attached to one surface of the rearrangement layer 30 in order to achieve miniaturization of the semiconductor package and improvement of reliability along with an excellent photovoltaic function by minimizing unnecessary connection parts inside the semiconductor package.

The rearrangement layer 30 may serve to electrically connect the individual photovoltaic particles. The position of the rearrangement layer 30 may not be limited to the position between the semiconductor layer 10 and the power generation connection layer 20, and, in order to increase power generation efficiency, the rearrangement layer 30 may extend outside with the photovoltaic particles attached thereto. For example, the rearrangement layer 30 may extend to at least a portion of an upper surface of the semiconductor layer 10 to form an extension 31, and it may be desirable that the photovoltaic particles 50 are positioned on the extension 31 to increase the amount of power generation.

Figure 6:
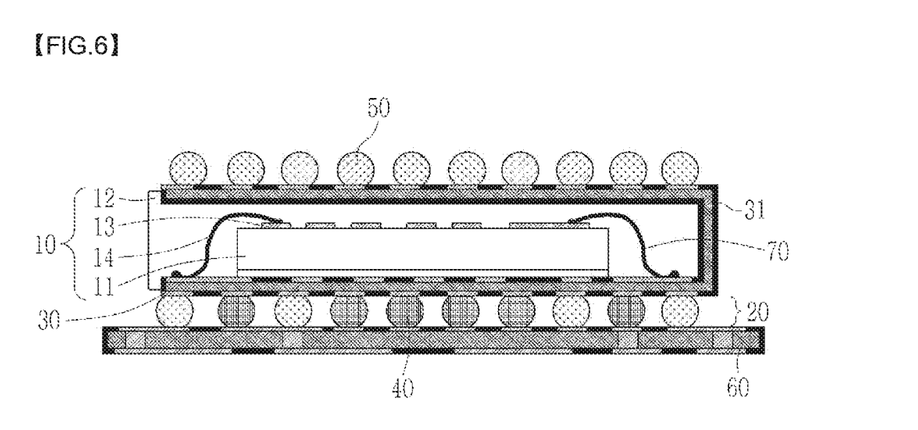
FIG. 6 is a cross-sectional view showing a structure in which an extension 31 of the rearrangement layer 30 is formed according to an embodiment of the present disclosure.

FIG. 6 shows an embodiment in which the extension 31 of the rearrangement layer 30 is formed and shows that the photovoltaic particles 50 are formed on the extension 31 covering the upper surface of the semiconductor layer 10. Furthermore, FIG. 6 shows an embodiment of the semiconductor layer in more detail. The feature of the semiconductor layer in FIG. 6 may all be applied to the feature of the semiconductor layer 10 of the present disclosure, but the feature of the semiconductor layer 10 of the present disclosure is not limited thereto. Referring to the semiconductor layer 10 in FIG. 6, pads 13 of the semiconductor chip 11 for processing information inside the semiconductor layer 10 may be electrically connected to the external terminals 40 in the power generation connection part 20 by a connection part 14. In addition, the mold portion 12 for protecting the semiconductor chip 11, the pads 13 of the semiconductor chip, the connection part 14, etc. may surround a portion of the rearrangement layer 30 to bond the rearrangement layer 30 and the semiconductor layer 10 in the semiconductor package.

Figure 7:
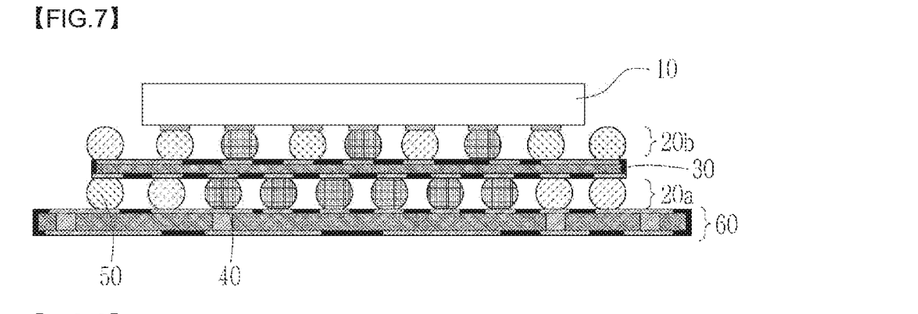
FIG. 7 is a cross-sectional view showing a structure in which power generation connection layers 20 are formed on both sides of the rearrangement layer 30 according to an embodiment of the present disclosure.

The external terminals 40 and the photovoltaic particles 50 may be formed on the other side as well as one side of the rearrangement layer 30 in order to increase the amount of power generation of the semiconductor package, so the power generation connection layer 20 may be formed on both sides of the rearrangement layer 30. The rearrangement layer 30 may connect the photovoltaic particles by wire bonding, flip chip bonding, etc., and the method of connecting the photovoltaic particles is not particularly limited. FIG. 7 schematically shows a structure in which the power generation connection layers 20 are formed on both sides of the rearrangement layer 30. Referring to FIG. 7, the external terminals and the photovoltaic particles are formed in each of the power generation connection layers 20a and 20b respectively on both sides of the rearrangement layer 30. Considering the direction in which light is incident, it may be desirable that the number of the photovoltaic particles distributed in the power generation connection layer 20b positioned above is greater than the number of the photovoltaic particles distributed in the power generation connection layer 20a contiguous to the substrate for more efficient photovoltaic power generation and improvement of the speed of processing information of the semiconductor package.

In order to increase the amount of light of the photovoltaic particles 50, various structures of a reflection portion may be additionally introduced into the semiconductor package, and, for example, the structure of the reflection portion may be formed by printing, mechanical processing, etc.

Figure 8:
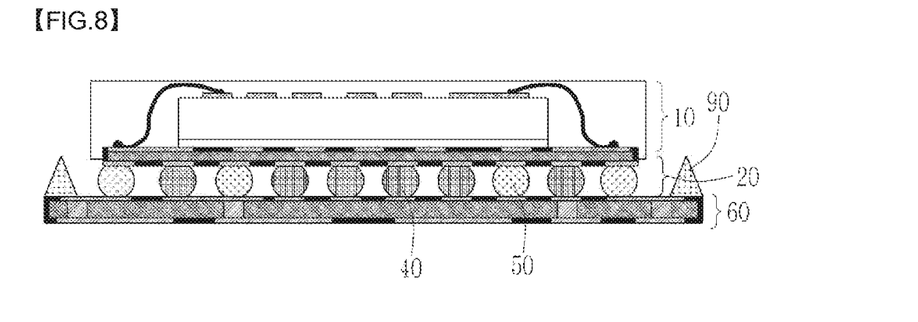
FIG. 8 is a cross-sectional view showing a structure in which reflection portions 90 are formed according to an embodiment of the present disclosure.
Figure 9:
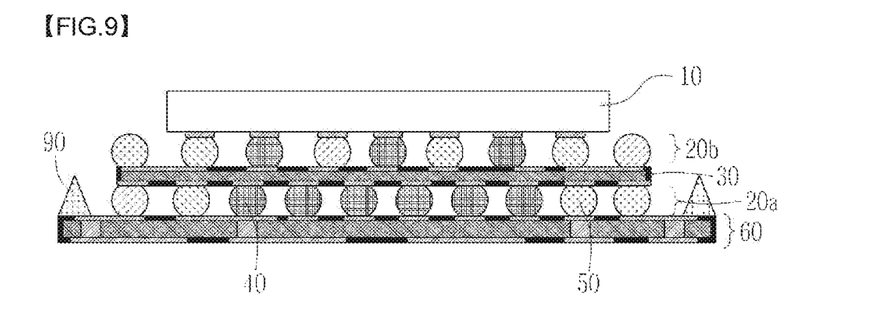
FIG. 9 is a cross-sectional view showing a structure in which the reflection portions 90 are formed and the power generation connection layers 20 are formed on both sides of the rearrangement layer 30 according to an embodiment of the present disclosure.

For example, to increase the amount of the light of the photovoltaic particles 50, the reflection portions may be formed around the power generation connection layer 20 on the substrate 60, given that the area of the substrate 60 is generally larger than that of the semiconductor layer 10 in the semiconductor package. In this case, the reflection portions 90 may be formed only on a portion of the perimeter of the power generation connection layer, or may be formed on the entire perimeter. FIGS. 8 and 9 are cross-sectional views schematically showing an embodiment in which the reflection portions are formed. When the reflection portions are formed around the power generation connection layer 20 on the substrate 60, even that is incident on the substrate but is not utilized as power for the semiconductor package may be reflected and transmitted to the power generation connection layer by the reflection portions so that the amount of light incident on the power generation connection layer may increase and the amount of power generation of the semiconductor package may increase.

The reflection portions 90 may be formed not only on the substrate but also on the rearrangement layer, and may be disposed between the external terminals 40 and the photovoltaic particles 50 in the power generation connection layer 20 so that an optical waveguide may be formed.

Figure 10:
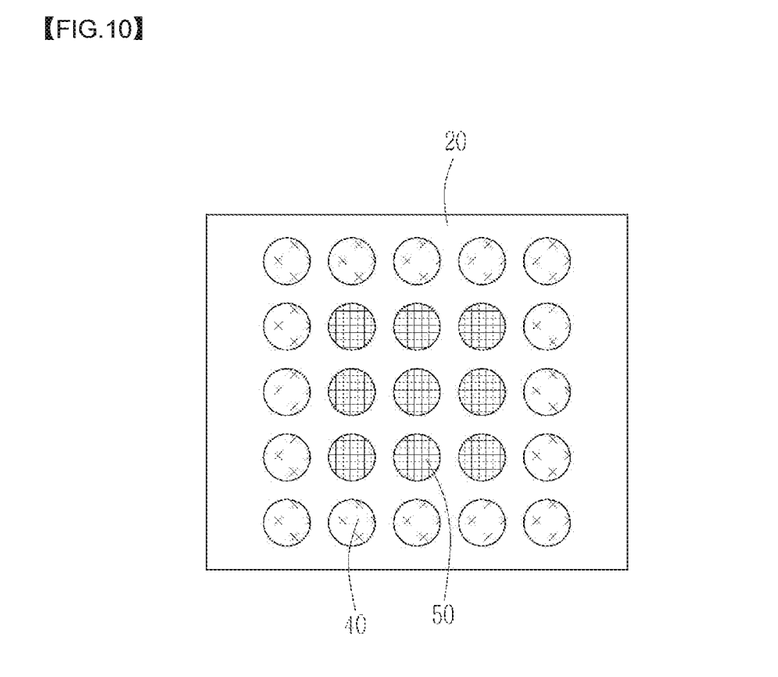
FIG. 10 is a bottom view showing an embodiment of the arrangement of external terminals 40 and the photovoltaic particles 50 in the power generation connection layer 20.

In the power generation connection layer 20, the photovoltaic particles 50 may be positioned together with the external terminals 40 below the semiconductor chip 11 in the semiconductor layer 10, and may be positioned below the semiconductor layer 10 but not below the semiconductor chip 11. However, since semiconductor chips generally have very low or no light transmittance, it may be desirable that the photovoltaic particles 50 are positioned on the periphery of the power generation connection layer 20 in order to maximize the amount of photovoltaic power generation of the semiconductor package when a certain number of the photovoltaic particles 50 is used. FIG. 10 is a bottom view showing an embodiment of the arrangement of the external terminals 40 and the photovoltaic particles 50 in the power generation connection layer 20, and shows that the photovoltaic particles are formed on the periphery of the power generation connection layer 20.

The semiconductor package may store electricity generated from the photovoltaic particles and include a battery to supply power to the semiconductor layer when light sources are insufficient, and it may be desirable that the battery is a rechargeable battery that can be charged and discharged.

Although the embodiments of the present disclosure have been described in detail above, the scope of the present disclosure is not limited thereto. In addition, it is to be understood by a person having ordinary skill in the technical field that various modifications and variations can be made within the scope of the technology of the present disclosure described in the appended claims.

What is claimed is:

1. A semiconductor packaging comprising:
   a power supply part, wherein the power support part is a plurality of photovoltaic particles having a core-shell structure including a core part and a shell part:
   a substrate;
   a power generation connection layer positioned on the substrate and including external terminals and the plurality of photovoltaic particles;
   a semiconductor layer positioned on the power generation connection layer; and
   wherein the power generation connection layer electrically connects the substrate to the semiconductor layer.

2. The semiconductor packaging of claim 1, wherein the core part and the shell part of the plurality of photovoltaic particles are different electrodes selected from an anode and a cathode.

3. The semiconductor packaging of claim 1, wherein the power generation connection layer includes the plurality of photovoltaic particles and the photovoltaic particles are connected to each other in series or in parallel.

4. The semiconductor packaging of claim 1, wherein the power generation connection layer includes the plurality of photovoltaic particles spaced apart from each other.

5. The semiconductor packaging of claim 1, wherein the semiconductor layer includes a semiconductor chip and a mold portion surrounding the semiconductor chip.

6. The semiconductor packaging of claim 5, wherein the mold portion allows light to pass through itself.

7. The semiconductor packaging of claim 1, further comprising:
   a rearrangement layer located between the power generation connection layer and the semiconductor layer,
   wherein the external terminals and the photovoltaic particles are formed as a single layer and attached to one surface of the rearrangement layer.

8. The semiconductor packaging of claim 7, wherein the rearrangement layer includes an extension extending to at least a portion of an upper surface of the semiconductor layer and the photovoltaic particles are positioned on the extension.

9. The semiconductor packaging of claim 7, wherein the external terminals and the photovoltaic particles are formed as a single layer and attached to the other surface of the rearrangement layer as well.

10. The semiconductor packaging of claim 1, wherein reflection portions are formed around the power generation connection layer on the substrate.

11. The semiconductor packaging of claim 1, wherein the photovoltaic particles are positioned around the power generation connection layer.

* * * * *